United States Patent [19]

Yamauchi

[11] Patent Number: 5,510,284
[45] Date of Patent: Apr. 23, 1996

[54] METHOD FOR MANUFACTURING AN ASYMETRIC NON-VOLATILE MEMORY

[75] Inventor: Yoshimitsu Yamauchi, Nabari, Japan

[73] Assignee: Sharp Kabushiki Kaisha, Osaka, Japan

[21] Appl. No.: 508,132

[22] Filed: Jul. 27, 1995

Related U.S. Application Data

[63] Continuation of Ser. No. 247,889, May 23, 1994, abandoned.

[30] Foreign Application Priority Data

Aug. 27, 1993 [JP] Japan .................................. 5-212958
Apr. 12, 1994 [JP] Japan .................................. 6-073603

[51] Int. Cl.⁶ .......................................... H01L 21/8247
[52] U.S. Cl. ................................. 437/43; 437/984
[58] Field of Search .............................. 437/43, 49, 52, 437/141, 162, 984; 257/316

[56] References Cited

U.S. PATENT DOCUMENTS

| | | | |
|---|---|---|---|
| 4,843,023 | 6/1989 | Chiu et al. | 437/34 |
| 5,030,584 | 7/1991 | Nakata | 437/44 |
| 5,091,328 | 2/1992 | Miller | 437/52 |

FOREIGN PATENT DOCUMENTS

| | | | |
|---|---|---|---|
| 59148367A | 8/1984 | Japan | 437/162 |
| 123768A | 9/1989 | Japan | 437/162 |
| 2201931A | 8/1990 | Japan | 437/162 |
| 2254760A | 10/1990 | Japan | 437/43 |
| 4-14880A | 1/1992 | Japan . | |

*Primary Examiner*—Mary Wilczewski
*Assistant Examiner*—Richard A. Booth
*Attorney, Agent, or Firm*—Nixon & Vanderhye

[57] ABSTRACT

A method for manufacturing a non-volatile memory comprising the steps of:

(i) forming a first electrode on a semiconductor substrate having a first insulating film;

(ii) implanting impurity ions to an area adjacent to one side of the first electrode while masking at least an area adjacent to another side of the first electrode;

(iii) forming a second insulating film on the semiconductor substrate including the first electrode, followed by depositing a conductive film on the entire surface of the second insulating film;

(iv) implanting impurity ions into the semiconductor substrate via the conductive film; and (v) patterning the conductive film to constitute a second electrode.

7 Claims, 5 Drawing Sheets

METHOD FOR MANUFACTURING AN ASYMETRIC NON-VOLATILE MEMORY

This is a Rule 62 File Wrapper Continuation of application Ser. No. 08/247,889, filed May 23, 1994, now abandoned.

BACKGROUND OF THE INVENTION

1. Field of the Invention

The present invention relates to a method for manufacturing a non-volatile memory, and more particularly to a method for manufacturing a non-volatile memory having a transistor using self-aligned offset source/drain.

2. Description of the Related Art

Proposals have been made on non-volatile memories in which an offset region is formed between a gate electrode and one of source/drain regions and another source/drain region is formed in self-alignment with respect to the gate electrode.

For example, Japanese Published Unexamined Patent Application No. HEI 4-14880 describes a method for forming a non-volatile memory which has a self-aligned offset region. The method for manufacturing one of such non-volatile memories will be detailed with reference to FIG. 15.

First, an oxide film 42 is formed on a P-type silicon substrate 41, and then, a polysilicon is deposited thereon and patterned into a desired configuration with the result that a first gate electrode 43 is formed. After one side of the first electrode 43 is covered with a resist (not shown in the drawing), N-type impurity ions are implanted using the first gate electrode 43 and the resist as a mask to form a lightly doped impurity diffusion layer 48. Then, after an oxide film 44 is formed on the silicon substrate 41 including the first gate electrode 43, a polysilicon is further deposited thereon. This polysilicon is etched with an anisotropic etching to form a polysilicon-made side wall spacer 45 on the side wall of the first gate electrode 43.

Then, this side wall spacer 45 serves as a mask for the ion implantation of N-type impurity ions 46. The substrate 41 thus implanted with N-type impurity ions 46 is subjected to heat treatment to form a diffusion layer 47. Thereafter, the side wall spacer 45 is removed by etching to form an oxide film on the first gate electrode 43, followed by forming a second gate electrode (not shown in the drawings).

In non-volatile memories formed by the above manufacturing method, the length of an offset region 49 can be determined by a region covered with the side wall spacer 45 with the result that the memory can be formed in self-alignment with respect to the end of the first gate electrode 43 and the memory can be well controlled and miniaturized.

However, the above method for manufacturing a non-volatile memory involves forming the gate oxide film below the first gate electrode 43 to a thickness 42 thinner than before along with the miniaturization of the cell area, which causes a problem that the silicon substrate 41 is likely to be damaged when the side wall spacer 45 is removed after ion implantation, and the thickness of the field oxide film becomes thinner, which decreases field inversion voltage. The above method further involves removing the polysilicon-made side wall spacer 45 and then an insulation film that constitutes an etching stopper of the side wall spacer 45, and further forming a second gate oxide film again, which causes another problem that the number of manufacturing steps increases.

SUMMARY OF THE INVENTION

The present invention provides a method for manufacturing a non-volatile memory comprising the steps of:

(i) forming a first electrode on a semiconductor substrate having a first insulating film;

(ii) implanting impurity ions to an area adjacent to one side of the first electrode while masking at least an area adjacent to another side of the first electrode;

(iii) forming a second insulating film on the semiconductor substrate including the first electrode, followed by depositing a conductive film on the entire surface of the second insulating film;

(iv) implanting impurity ions into the semiconductor substrate via the conductive film; and (v) patterning the conductive film to constitute a second electrode.

An object of the invention is to provide a method for manufacturing a non-volatile memory that allows manufacturing fine memory cells efficiently to prevent damaging the substrate and to prevent filed inversion voltage decrease caused by filed oxide thinning.

DESCRIPTION OF PREFERRED EMBODIMENTS

Figure 1:
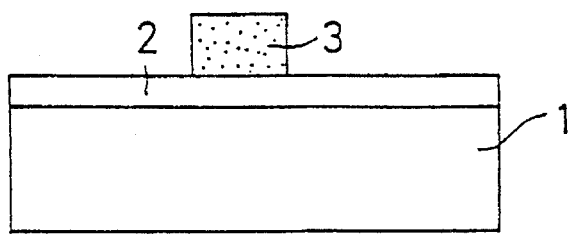
FIG. 1 is a schematic sectional view of Embodiment 1 of a method for manufacturing a non-volatile memory according to the present invention, the view illustrating a first step of the method.

The substrate used in the non-volatile memory of the present invention is not particularly limited to any specific type, but either a P-type or an N-type silicon substrate is preferable. Then, a device isolation film is formed on the substrate with a known method such as the LOCOS method or the like.

A preferred aspect of the invention includes a method for manufacturing a non-volatile memory including the steps of: (i) forming a floating gate on a semiconductor substrate having a first insulating film; (ii) implanting impurity ions to an area adjacent to one side of the floating gate while masking at least an area adjacent to another side of the floating gate; (iii) forming a second insulating film on the semiconductor substrate including the floating gate, followed by depositing a conductive film on the entire surface of the second insulating film, the conductive film at a sidewall of the floating gate being thicker in a substantially vertical direction than a portion of the conductive film in a substantially horizontal direction; (iv) implanting impurity ions into the semiconductor substrate via the conductive film to form an offset region located underneath the floating gate and thicker portion of the conductive film and source/drain regions located underneath the other portion of the conductive film; and (v) patterning the conductive film to constitute a control gate.

At step (i), a first gate insulating film is formed on the semiconductor substrate. The first gate insulating film is not limited to any specific type, but a $SiO_2$ film is preferable. When the $SiO_2$ film is used, the $SiO_2$ film is preferably formed to a thickness in the range of about 6 to 40 nm with a known method such as the thermal oxidation process or the like.

Further, a first electrode is formed on the first gate insulating film. The material of the first electrode is not particularly limited to any specific type as long as it is normally used for electrodes. A polysilicon, silicide comprising such as Ti, Ta, W or the like, or polycide including the above silicide and polysilicon can be used. In particular, polysilicon is preferable. Polysilicon can be formed with a known method such as the CVD method or the like. When the polysilicon is used, the thickness of first electrode is preferably in the range of about 1000 to 5000 angstrom.

At step (ii), a resist is formed which covers at least an area adjacent to one side of the first electrode, preferably the above adjacent area to one side of the first electrode and one part of the semiconductor substrate with a known method such as photolithograhy or the like. Then, the first electrode and the resist are used as a mask to implant impurity ions having a conductive type different from the semiconductor substrate, for example, phosphorus or arsenic ions are implanted in the range of about $1\times10^{14}$ to $1\times10^{16}$ ions/cm$^2$ at about 40 to 80 KeV into an area adjacent to another side of the first electrode.

At step (iii), a second insulating film of $SiO_2$ or SiN, or $SiO_2$ and SiN is formed on the semiconductor substrate including a first electrode. The second insulating film may be formed by a known method preferably to a thickness of about 100 to 400 angstrom. Incidentally, the first gate insulating film is preferably removed except for the place underling the first electrode before the second insulating film is formed.

Subsequently, a conductive film is deposited on the second insulating film. The material of the conductive film is not particularly limited to any type as long as it can be normally used in an electrode. For example, a polysilicon, a metal silicide formed of polysilicon and a metal having a high melting point, such as tungsten, titanium or tantalum, or a polycide including the above silicide and polysilicon can be used as the conductive film. When the polysilicon is used, the conductive film can be formed with a known method such as the CVD method or the like. Preferably, the thickness thereof is in the range of about 500 to 2000 angstrom.

At step (iv), impurity ions are implanted into the semiconductor substrate including the first electrode and the conductive film thereby forming an impurity diffusion layer, the impurity ions having a conductive type different from the semiconductor substrate; for example, into a P-type semiconductor substrate are implanted N-type impurity ions such as phosphorus or arsenic ions in the range of about $1\times10^{14}$ to $1\times10^{16}$ ions/cm$^2$ at about 80 to 160 KeV, using a part of the conductive film projected with the first electrode as a mask. Then, the semiconductor substrate thus ion implanted is subjected to heat treatment at about 900° to 1000° C. to form an impurity diffusion layer which constitutes a source/drain region.

At step (v), the conductive film formed on the first electrode is patterned into a desired configuration to constitute a second electrode. In this process, on the conductive film formed at step (iii) may be further deposited a different conductive film, which is followed by patterning the conductive film to constitute a second electrode. For example, at step (iii), a polysilicon film is formed, and then a metal film having a high melting point such as tungsten, titanium, tantalum or the like or a metal silicide having a high melting point such as tungsten silicide, titanium silicide, tantalum silicide or the like may be laminated followed by patterning the laminate to constitute a second electrode in this step. Otherwise, at step (iii), the silicide film having a high melting point is formed, and then a polysilicon film or the like can be laminated followed by patterning the laminate to constitute a second electrode.

The method for manufacturing a non-volatile memory according to the present invention requires controlling the length of the offset region (hereinafter referred to as $L_{off}$ in accordance with the thickness of the gate insulating film formed on a portion that constitutes an offset region. Therefore, at step (iii), the thickness of the conductive film is appropriately adjusted to constitute a mask preferable for ion implantation for forming a diffusion layer followed by depositing a different conductive film at step (V), as described above, for obtaining properties preferable for the second electrode thereby forming the second electrode.

In addition, for obtaining a desired length of the offset region, a side wall spacer can be formed on the conductive film which constitutes an ion implantation mask. This enables the adjustment of $L_{off}$. The side wall spacer in this process can be formed by depositing on the conductive film an insulating film, for example, $SiO_2$ film to a thickness in the range of about 1000 to 5000 angstrom, followed by etch-backing the insulating film with anisotropic etching. In addition, the side wall spacer can be removed by wet etching or the like with HF solution after the ion implantation.

The method for manufacturing a non-volatile memory in accordance with the present invention can be applied not only to EPROM's but also to flash EEPROM's with the same structure having two or more layered gate electrode, mask ROM's and DRAM's.

Figure 4:
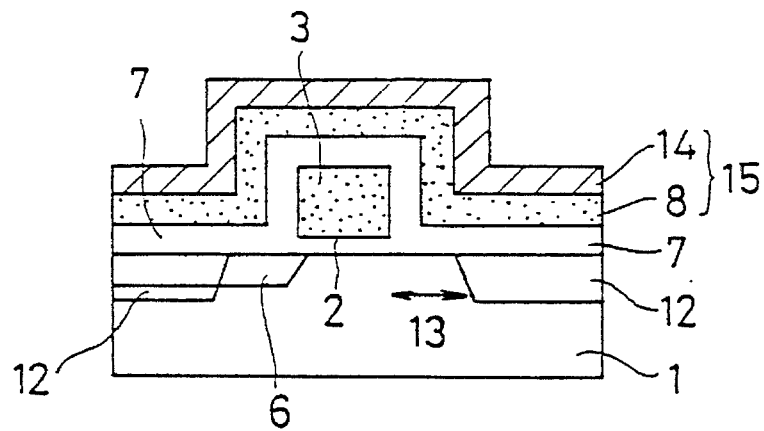
FIG. 4 is a schematic sectional view of Embodiment 1 of a method for manufacturing a non-volatile memory according to the present invention, the view illustrating a forth step of the method.
Figure 8:
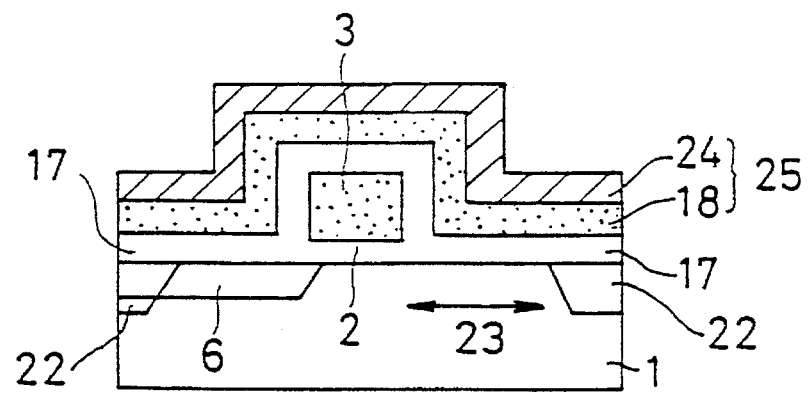
FIG. 8 is a schematic sectional view of Embodiment 2 of a method for manufacturing a non-volatile memory according to the present invention, the view illustrating a forth step of the method.
Figure 12:
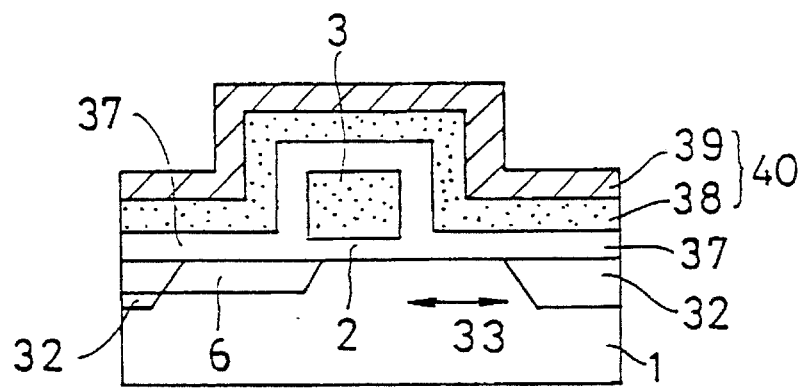
FIG. 12 is a schematic sectional view of Embodiment 3 of a method for manufacturing a non-volatile memory according to the present invention, the view illustrating a forth step of the method.

Among memories to which the present invention can be applied, the type which is available to write data from the source side to the floating gate includes one with a structure having a cross-section shown in FIG. 4, FIG. 8 and FIG. 12. Such memory can be operated with 5 V single power source, 3.3 V single power source or the like.

Figure 13:
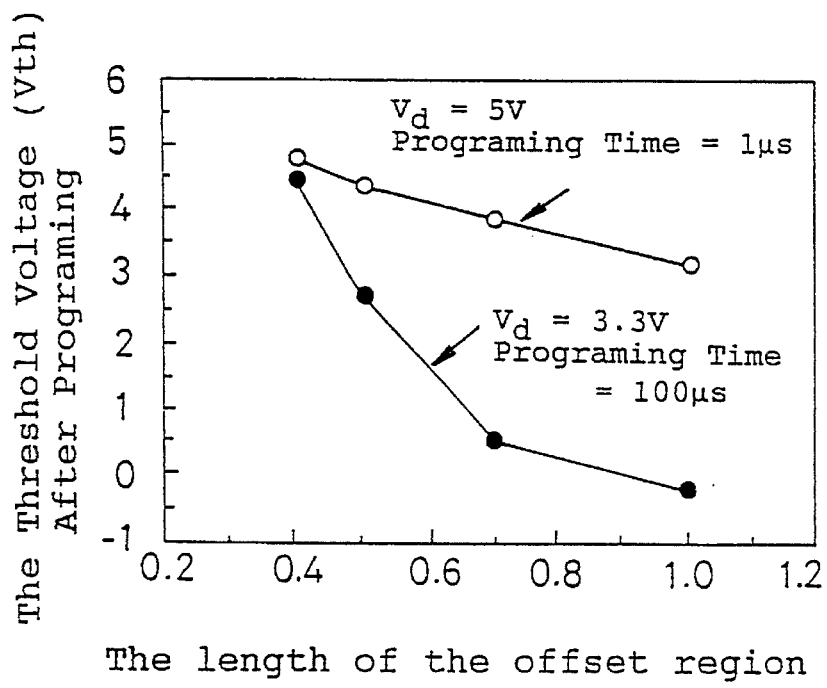
FIG. 13 is a view showing a relation between the threshold voltage of a memory cell and the length of an offset region after programming.
Figure 14:
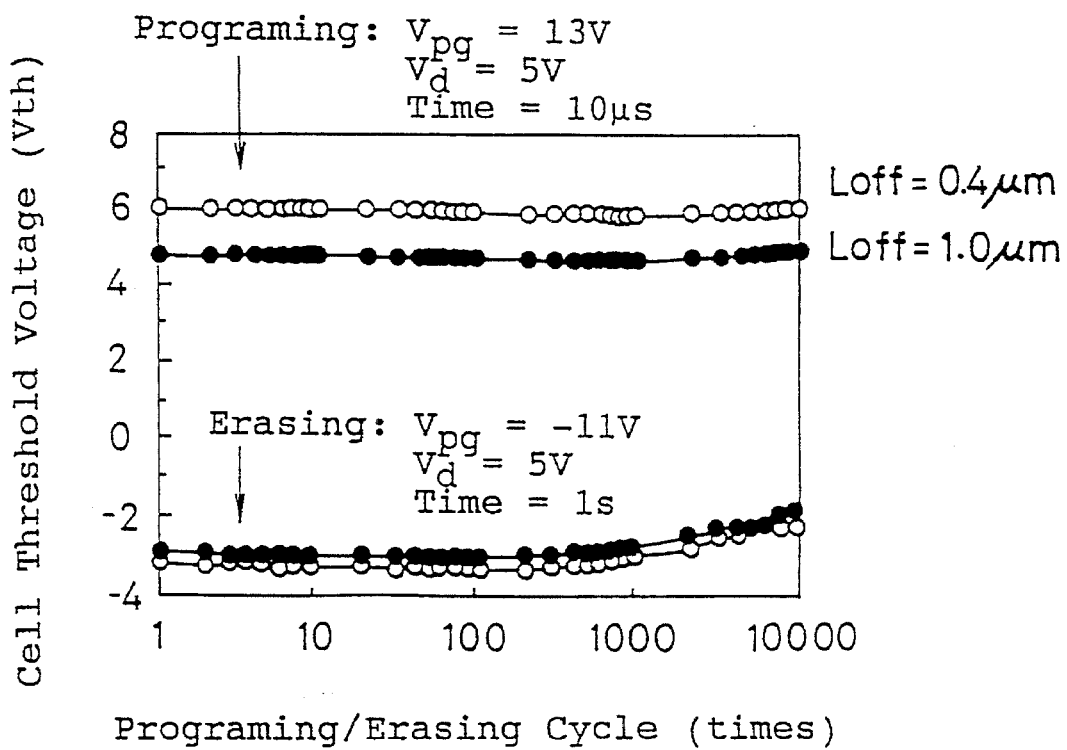
FIG. 14 is a view showing a relation between the threshold voltage of a memory cell and the programming/erasing cycle.
Figure 15:
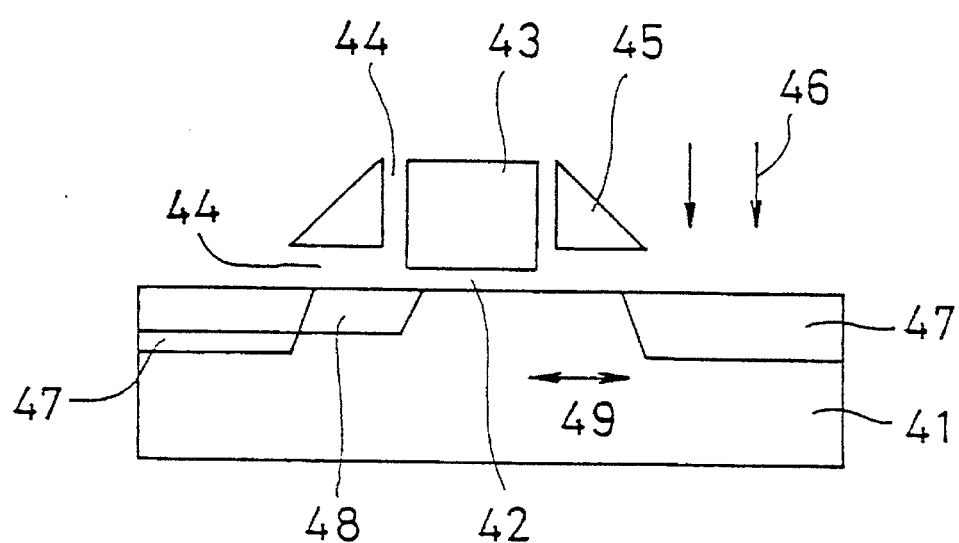
FIG. 15 is a schematic sectional view of a conventional non-volatile memory.

FIG. 13 shows a relation between the threshold voltage Vth of the memory cell after programming and the length of the offset region $L_{off}$ when voltage of 5 V is applied to a drain formed opposite to the offset region and when voltage of 3.3 V is applied to the same drain. When voltage of 5 V is applied to the drain, the writing properties do not depend on $L_{off}$. On the other hand, when voltage of 3.3 V was applied to the drain, the writing properties strongly depends on $L_{off}$. Raising the threshold voltage of the memory cell to a considerable value requires dropping $L_{off}$. Consequently, memories with sufficiently small $L_{off}$ can be manufactured with the method for manufacturing a non-volatile memory according to the present invention, even when the device requires a lower voltage to be applied in accordance with the development. Furthermore, as shown in FIG. 14, even when the $L_{off}$ drops to a small value of about 0.4, writing frequency equal to $L_{off}$ of about 1.0 μm can be realized.

An embodiment of the method for manufacturing non-volatile memory according to the present invention will be detailed with respect to an EPROM with reference to drawings. Incidentally, the present invention is not limited thereto.

EXAMPLE 1

First, on P-type silicon substrate 1 is formed a field oxide film (not shown in the drawings) with the LOCOS method to define a device formation region. At the subsequent step, as shown in FIG. 1, a first gate oxide film 2 is formed on the silicon substrate 1 to a thickness in the range of about 8 to 10 nm with thermal oxidation. Then, a polysilicon film is formed to a thickness in the range of about 450 nm on the first gate oxide film 2 by CVD method followed by patterning the polysilicon film into a desired configuration thereby constituting a first electrode 3.

Figure 2:
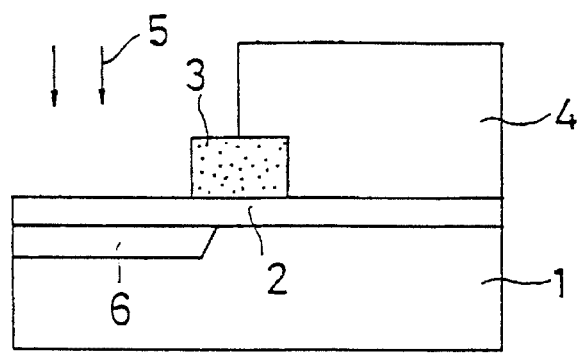
FIG. 2 is a schematic sectional view of Embodiment 1 of a method for manufacturing a non-volatile memory according to the present invention, the view illustrating a second step of the method.

Then, as shown in FIG. 2, a resist 4 covering one end of the first electrode 3 and a part of the silicon substrate is formed with photolithography technique followed by implanting arsenic ions 5 of about $3\times10^{15}$ ions/cm$^2$ at about 40 KeV using the resist 4 as a mask thereby forming a diffusion layer 6.

Figure 3:
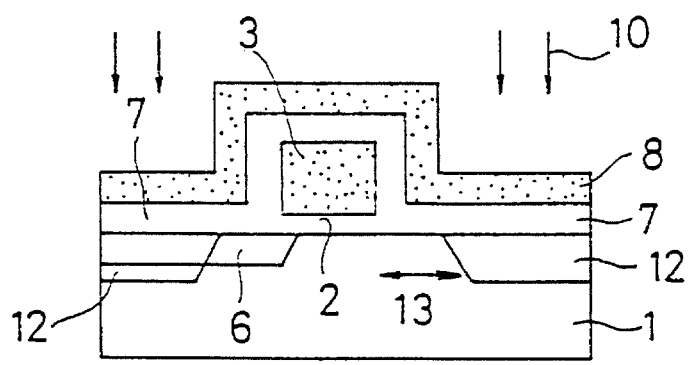
FIG. 3 is a schematic sectional view of Embodiment 1 of a method for manufacturing a non-volatile memory according to the present invention, the view illustrating a third step of the method.

As shown in FIG. 3, the resist 4 is removed. Then after the first gate oxide film 2 is removed except for the place underling first electrode 3, a second gate insulating film 7 comprising $SiO_2$ is formed to a thickness of about 200 angstrom on the silicon substrate 1 including the first electrode 3 followed by depositing a polysilicon film 8 to a thickness of about 2000 angstrom. Then phosphorus ions of about $5\times10^{14}$ ions/cm$^2$ at about 80 KeV is implanted, followed by subjecting it to heat treatment at about 900° C. for about 30 minutes to form a diffusion layer 12. In this process, a polysilicon film 8 having a definite thickness is formed on the side wall of the first electrode 3. Thus, the polysilicon film 8 serves as an ion implantation mask to allow an offset region 13 to be formed in the neighborhood of the diffusion layer 12 on a side where the diffusion layer 6 is not formed. Incidentally, in the embodiment of the present invention, the length of the offset region $L_{off}$ is about 0.2 μm.

Then, as shown in FIG. 4, a WSix film 14 is deposited to a thickness of about 1500 angstrom on the polysilicon film 8 thereby forming a second electrode 15 comprising a polysilicon film 8 and a WSiX film 14, and having a desired thickness as an electrode.

EXAMPLE 2

Figure 5:
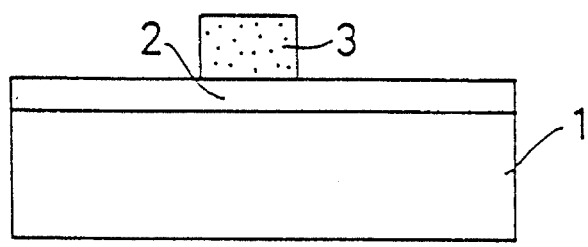
FIG. 5 is a schematic sectional view of Embodiment 2 of a method for manufacturing a non-volatile memory according to the present invention, the view illustrating a first step of the method.
Figure 6:
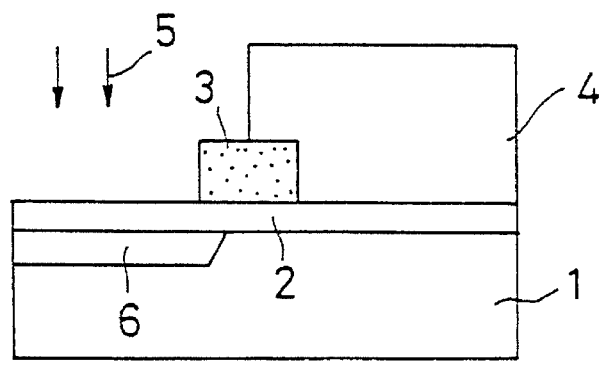
FIG. 6 is a schematic sectional view of Embodiment 2 of a method for manufacturing a non-volatile memory according to the present invention, the view illustrating a second step of the method.

In the same manner as Embodiment 1, a first gate oxide film 2 and a first electrode 3 (see FIG. 5) are subsequently formed on a silicon substrate 1 on which a field oxide film is formed. Then the resist 4 is used to implant arsenic ions 5 for forming a diffusion layer 6 (see FIG. 6).

Figure 7:
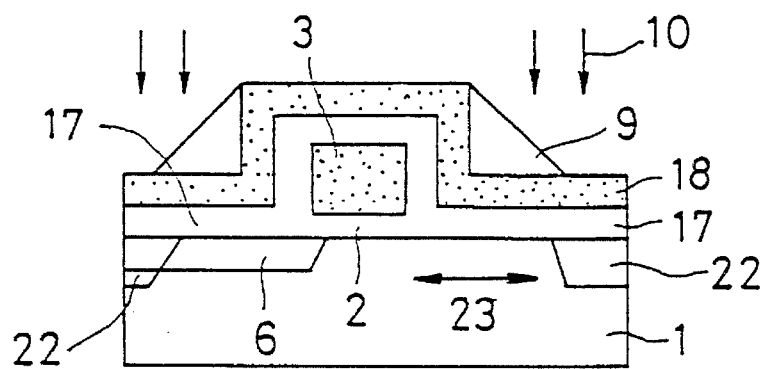
FIG. 7 is a schematic sectional view of Embodiment 2 of a method for manufacturing a non-volatile memory according to the present invention, the view illustrating a third step of the method.

Then, as shown in FIG. 7, in the same manner as Embodiment 1, a second gate oxide film 17 is formed on the first electrode 3 to a thickness of about 200 angstrom followed by depositing a polysilicon layer 18 to a thickness of about 1000 angstrom. Thereafter, an $SiO_2$ film is formed to a thickness of about 500 angstrom, which is etched back with isotropic etching to form a side wall spacer 9 on the side wall of the first electrode 3.

Subsequently, this side wall spacer 9 and the first electrode 3 are used as a mask to implant phosphorus ions of about $5\times10^{14}$ ions/cm$^2$ at about 80 KeV followed by subjecting the substrate to heat treatment at about 900° C. to form a diffusion layer 22. The $L_{off}$ becomes approximately 0.6 μm.

Thereafter, as shown in FIG. 8, the side wall spacer 9 was removed in HF solution. Then, the WSix/Si film 24 was deposited on the polysilicon film 18 to a thickness of about 1500 angstrom to form a second electrode 25.

EXAMPLE 3

Figure 9:
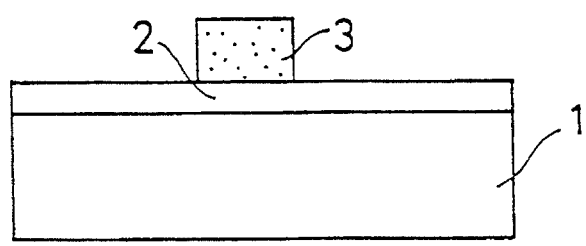
FIG. 9 is a schematic sectional view of Embodiment 3 of a method for manufacturing a non-volatile memory according to the present invention, the view illustrating a first step of the method.
Figure 10:
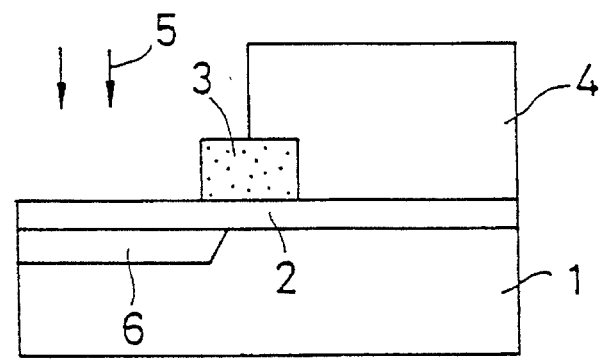
FIG. 10 is a schematic sectional view of Embodiment 3 of a method for manufacturing a non-volatile memory according to the present invention, the view illustrating a second step of the method.

In the same manner as Embodiment 1, a first gate oxide film 2 and the first electrode 3 are further formed in this order (FIG. 9) on the silicon substrate 1 on which the field oxide film is formed. Then, a resist 4 is used as a mask to implant arsenic ions 5 to form a diffusion layer 6 (FIG. 10).

Figure 11:
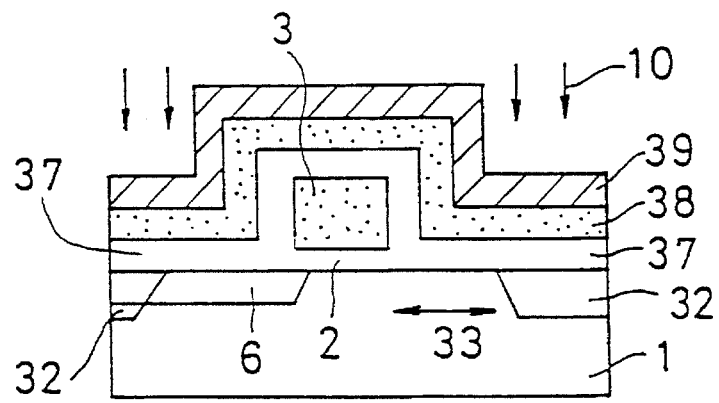
FIG. 11 is a schematic sectional view of Embodiment 3 of a method for manufacturing a non-volatile memory according to the present invention, the view illustrating a third step of the method.

Then as shown in FIG. 11, after a second gate oxide film 37 is formed to a thickness of about 150 angstrom on the first electrode 3 in the same manner as Embodiment 1, a polysilicon film 38 having a thickness of about 1500 angstrom and a WSix film 39 having a thickness of about 1500 angstrom are subsequently laminated in this order. Then phosphorus ions 10 of about $1\times10^{15}$ ions/cm$^2$ are implanted at about 160 KeV through the polysilicon film 38 and the WSix film 39 followed by heat treatment to form a diffusion layer 32. The $L_{off}$ becomes about 0.4 μm.

Later, as shown in FIG. 12, a WSix/Si-made second gate electrode 40 is formed by patterning a polysilicon film 38 and a WSix film 39 into a desired configuration.

In this way, in accordance with the above method for manufacturing a non-volatile memory, offset regions 13, 23 and 33 are formed in self-alignment with respect to the first electrode 3 because part of the conductive film, i.e., the second electrode can be used as a mask.

In case of using the side wall spacer 9 for implanting ions to form the diffusion layer 22, even when the side wall spacer 9 is removed by etching, a damage of the silicon substrate 1 and a reduction in the thickness of the device isolation film can be prevented because the polysilicon film 18 is formed between the silicon substrate 1 and the side wall spacer 9, and the polysilicon film, i.e., the conductive film serves as a stopper of etching. Besides, the conductive film used as the stopper can be used as a second electrode as it is, so the manufacturing process does not necessarily require an increase in the number of manufacturing steps.

Furthermore, the method include a step in which the tungsten silicide films 14, 24 and 39 comprising the tungsten having a high melting point are formed on the polysilicon films 8, 18 and 38 to form the second electrodes 15, 25 and 40, whereby reducing the resistance of the second electrodes 15, 25 and 40 in the non-volatile memory thus obtained.

Consequently, the above method can prevent a deterioration in the performance of the non-volatile memory being caused by a damage of the semiconductor substrate or the like and a fall in the field inversion voltage thereby realizing an enlargement of the capacity of the memory.

The present invention thus being described, the other embodiments and the modification thereof are possible.

What is claimed is:

1. A method for manufacturing a non-volatile memory comprising the steps of:

(i) forming a floating gate on a semiconductor substrate having a first insulating film;

(ii) implanting impurity ions to an area adjacent to one side of the floating gate while masking at least an area adjacent to another side of the floating gate;

(iii) forming a second insulating film on the semiconductor substrate including the floating gate, followed by depositing a conductive film on the entire surface of the second insulating film, the conductive film including an upright portion and a horizontally extending portion, the height of the upright portion of the conductive film at a sidewall of the floating gate being greater than the height of the horizontally extending portion of the conductive film, (iv) implanting impurity ions into the semiconductor substrate via the conductive film to form an offset region located between the floating gate and one of source/drain regions and underneath the upright portion of the conductive film and source/drain regions located underneath the horizontally extending portion of the conductive film; and (v) patterning the conductive film to constitute a control gate.

2. A method for manufacturing a non-volatile memory according to claim 1 wherein the conductive film formed in the step (iii) is laminated with a further insulating film, followed by anisotropic etching to form a side wall spacer leaving the insulating film only on the sidewalls of the conductive film.

3. A method for forming anon-volatile memory according to claim 1 wherein the conductive film formed in step (iii) is made of polysilicon laminated with a metal silicide, and in step (v) the conductive film is patterned by anisotropic etching to form a control gate.

4. A method for forming a non-volatile memory according to claim 1 wherein the impurity ions in the step (ii) are implanted in a dose of about $1 \times 10^{14}$ to $1 \times 10^{16}$ ions/cm$^2$, the impurity ions in the step (iv) are implanted in the range of about $1 \times 10^{14}$ to $1 \times 10^{16}$ ions/cm$^2$.

5. A method for forming a non-volatile memory according to claim 1 wherein the conductive film formed in the step (iii) is formed to a thickness of about 500 to 2000 angstroms.

6. A method of forming a non-volatile memory according to claim 1 wherein the second insulating film formed in the step (iii) is formed to a thickness of about 100 to 400 angstroms.

7. A method for forming a non-volatile memory according to claim 1 wherein the control gate is formed at least overlying the floating gate and the offset region.

* * * * *